United States Patent

Buck et al.

[15] 3,679,946

[45] July 25, 1972

[54] STRIP MOUNTED SEMICONDUCTOR DEVICE

[72] Inventors: Robert E. Buck; Robert W. Metzger, Jr.; Albert D. Rittmann; Eugene H. Sayers, all of Kokomo, Ind.

[73] Assignee: General Motors Corporation, Detroit, Mich.

[22] Filed: July 6, 1970

[21] Appl. No.: 60,997

Related U.S. Application Data

[62] Division of Ser. No. 686,589, Nov. 29, 1967.

[52] U.S. Cl. ....................317/234 R, 317/234 N, 317/234 E, 317/234 G, 29/289, 29/193

[51] Int. Cl. ....................H01l 3/00, H01l 5/00

[58] Field of Search ....................317/234, 5.4, 6, 4, 3; 29/193, 29/193.5, 589

[56] References Cited

UNITED STATES PATENTS

| | | | |
|---|---|---|---|
| 3,171,187 | 3/1965 | Ikeda et al. | 29/25.3 |
| 3,281,628 | 10/1966 | Bauer et al. | 317/234 |
| 3,368,114 | 2/1968 | Cambell et al. | 317/101 |
| 3,395,447 | 8/1968 | Beyerlein | 29/588 |

*Primary Examiner*—John W. Huckert
*Assistant Examiner*—Andrew J. James
*Attorney*—William S. Pettigrew and Robert J. Wallace

[57] ABSTRACT

A semiconductor package assembly and method of making it. A semiconductive element is mounted on a flat strip. A portion of the strip is partially separated from, and raised above the plane of, the strip. The raised portion is eventually completely separated from the strip, and forms a terminal member for the semiconductive element. The element and connection to the terminal are enclosed, perferably in a plastic potting. Means are provided to increase the rigidity of the strip in the enclosure area. Means are also provided to enhance adhesion of a plastic potting to the strip and terminal members. A plurality of devices can be simultaneously or successively formed from a single strip. Multiple terminal devices can be formed using adjacent multiple raised portions on the strip.

8 Claims, 5 Drawing Figures

Fig.3

INVENTORS
Robert E. Buck,
Robert W. Metzger, Jr.,
BY Albert D. Rittmann, &
Eugene H. Sayers
R. J. Wallace
ATTORNEY

STRIP MOUNTED SEMICONDUCTOR DEVICE

This application is a division of U.S. patent application Ser. No. 686,589 entitled "Strip Mounted Semiconductor Device," filed Nov. 29, 1967 in the names of Robert E. Buck, Robert W. Metzger, Jr., Albert D. Rittmann and Eugene H. Sayers, and assigned to the assignee of this application.

BACKGROUND OF THE INVENTION

This invention relates to encapsulated, strip-mounted semiconductor devices, particularly to plastic encapsulated higher power dissipation devices.

Plastic encapsulation and strip mounting are already being used in commercially available semiconductor devices. However, this type of assembly technique is only used for low power devices, that is, devices which handle less than one ampere. This technique was generally used to make devices, such as are described in U.S. Pat. No. 3,281,628 Bauer et al.

The first commercially available semiconductor devices were packaged by mounting the semiconductor element on a conductive base within a hermetically sealed enclosure. The enclosure was usually sealed by welding, crimping, soldering, etc. With the advent of moisture impervious surface passivation techniques, it is no longer necessary to hermetically enclose many semiconductor devices. For this reason many semiconductor manufacturers have been able to encapsulate their devices in a plastic potting, generally by transfer-molding. Coincidentally they may also use a strip mount technique of assembly. In this latter technique a metal strip, preferably of copper, is initially punched to provide a plurality of groups of terminal members, all held together by interconnecting web portions. The semiconductor element is mounted on one of the prepunched terminals in each group, and appropriately electrically connected to the others of that group. The element and terminal connections are then encapsulated in plastic and the encapsulated terminal group is then punched free of the web.

Because of difficulties which will hereinafter be discussed, the strip mount technique has been limited to small signal devices, or at best, low power dissipation semiconductor devices.

The most common method of fabricating a strip-mounted plastic encapsulated transistor involves a prepunched ladder-like strip in which the terminal groups are arranged like rungs in a ladder. In order to achieve a mechanically rugged structure by this method, the semiconductor wafer and terminal connection area must be completely enveloped by a plastic encapsulation. If not enveloped, the low adhesive characteristics of the transfer molding compounds used would allow the plastic to easily be separated from the terminals. This applies to both the mold-release-filled epoxy molding compounds, as well as the silicone molding compounds, which due to their basic silicone structure are poorly adhesive. Plastic, as is known, is a poor heat conductor. Hence, virtually all of the heat generated by the semiconductor wafer during operation must be removed by traveling along the length of terminal on which the wafer is mounted to a point outside the plastic encapsulation where that terminal is attached to a heat sink. This factor has limited the application of this design of package to a low power dissipation device.

If the plastic potting is applied to only one face of the mounting terminal, other problems ensue. Separate soldered terminals must be provided in addition to the mounting terminal of the strip. Moreover, the mounting terminal itself of such a device necessarily has to be thin, so that it can be easily formed and punched. Consequently, it bends easily and can be readily separated from the relatively non-adhesive plastic potting. In addition, we have noted that stresses imparted to the separate soldered terminals are readily transmitted to the semiconductor wafer.

SUMMARY OF THE INVENTION

It is therefore, a primary object of this invention to provide an improved strip-mounted, plastic encapsulated semiconductor device which is particularly useful in higher power dissipation applications.

The objects of this invention are attained with a device in which the semiconductor wafer is mounted on a strip, with connecting terminals being formed from adjacent portions of that strip which are raised above the surface of the strip, and connected to the wafer by a flexible bond. In addition, means are provided to both increase rigidity of the strip and adhesion of the plastic potting to it. The plastic potting can then be adhesively applied only to the face of the strip on which the wafer is mounted.

In the preferred method of this invention, the terminal is produced from an edge portion of the strip. A short length is cut along the edge of the strip and separated from the strip at one end. This end is raised above the surface of the strip and connected, as by a wire bond, to the semiconductive wafer. After encapsulation, the other end of the length is separated from the strip to produce the separate terminal.

BRIEF DESCRIPTION OF THE DRAWING

Other objects, features and advantages of the invention will become more apparent from the following description of a preferred example thereof and from the drawing, in which.

DESCRIPTION OF THE PREFERRED EMBODIMENTS

Figures 1, 2, 3, 4, 5:
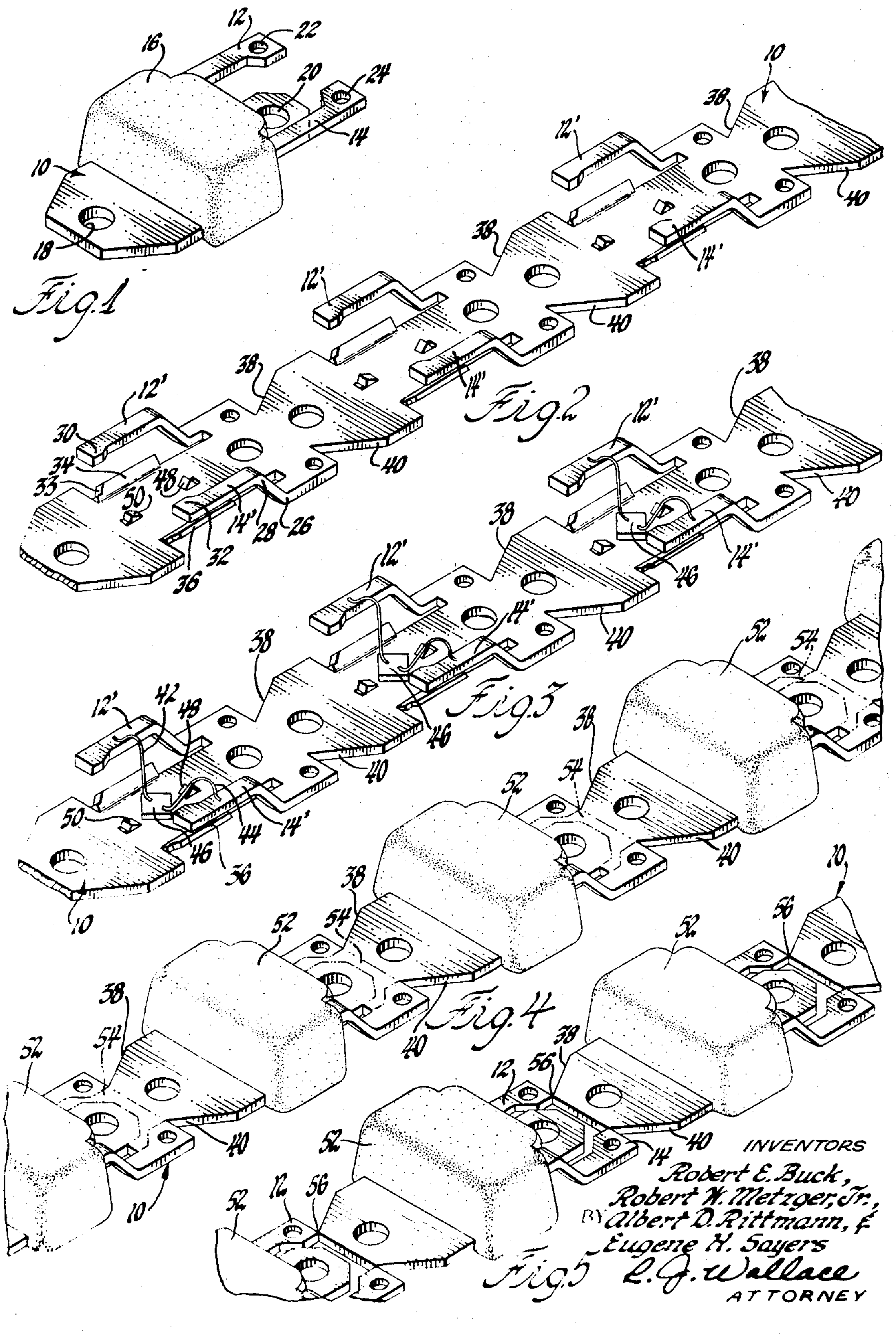
FIG. 1 shows an isometric view of a transistor package such as encompassed by the invention.
FIGS. 2 through 5 show isometric views of the various successive stages in the simultaneous assembly of a plurality of transistor packages such as shown in FIG. 1 from a single metal strip.

FIG. 1 shows a transistor package made in accordance with the invention. The package involves a flat metal strip 10, serving as a base member and collector terminal for the package. Additional terminal elements 12 and 14 serve as emitter and base terminals. The semiconductive transistor element (not shown) is enclosed by a plastic potting composition 16, which also encloses the ends of terminal members 12 and 14. However, the potting does not extend below the plane of the lower surface of the strip, or cover the entire upper surface. The ends of the base member, containing aperatures 18 and 20 are left exposed for mounting purposes. The device is most suitably mounted on a heat sink or other heat transfer means. Apertures 22 and 24 in terminal members 12 and 14, respectively, facilitate connection of appropriate wire leads to the terminal members. While the exposed portions of terminals 12 and 14 are shown parallel to the base 10, they can be readily bent to any desired angle to suit a particular application.

As previously indicated, our new package design is produced from a relatively thin flat strip in a simplified, novel assembly technique which facilitates rapid, reliable, automatic fabrication of the package. A preferred example of one package and embodiment of the method is illustrated in FIGS. 2 through 5. However, this technique can be used to produce other package embodiments, as will become more apparent.

As can be seen in connection with FIG. 2, terminal members 12 and 14 are initially formed by cutting parallel generally linear margin areas along opposite edges of a copper strip of about 0.06 inch in thickness. The margin areas are severed at one end. The severed ends of the margin areas are then raised above the plane of the strip, with 45° bends at points 26 and 28, forming the terminal member plateau areas 12' and 14'. The raised plateau areas 12' and 14' have enlarged end portions 30 and 32, respectively. The enlarged end portion 30 is formed from a cutout 33 in the canted edge section 34 of strip 10. The enlarged end portion 32 of plateau area 14' is similarly formed from a cutout 36 in another canted region on the opposite side of strip 10. Strip 10 is notched on opposite sides at 38 and 40 between each individual package segment in the strip.

Reference is now made to FIG. 3. Filaments 42 and 44 of gold wire respectively connect terminal member plateau areas 12' and 14' respectively with a semiconductor element 46. Wires of other metals, such as aluminum, can also be used. The filaments 42 and 44 are of appropriate diameter to handle the currents involved. They are generally of about 5 mils in diameter but can be of appreciably larger size, for example up to about approximately 25 mils in diameter.

The semiconductive element 46 can be of any particular type and in this particular instance represents a transistor wafer having base and emitter on an upper surface and a collector contact on its lower surface. The semiconductor wafer is soldered to base member 10 so that base member 10 functions as a collector terminal for the completed device. The metal filaments are bonded to the plateau areas 12' and 14' and the semiconductive element by means of thermocompression bonding, ultrasonic bonding, or the like. Preferably the semiconductive element is passivated as by a coating of varnish, silicone grease, room temperature vulcanizable rubber, or the like. Further, if desired, the metal filaments can be isolated from the rigid epoxy potting subsequently applied. One can do this by initially enveloping the semiconductive wafer and its associated wire connectors in a resilient potting composition and, then, applying the potting composition. Room temperature vulcanizable rubber, silicone resin, or the like can be used as the isolating composition.

The semiconductive wafer is soldered to a central region of the strip 10 between the canted edge portion of the strip and raised tabs 48 and 50 in the center of the strip. Tabs 48 and 50 are sections of the strip cut and raised above the level of the strip leaving an aperture underneath into which potting compound can subsequently flow.

As seen in FIG. 4 the potting composition 52 is applied only to the upper surface of strip 10. It is preferably applied by transfer-molding. However, it can be cast by any other suitable technique. The potting composition flows around and under the canted side portions of strip 10, as well as underneath tabs 48 and 50. However, it does not extend below the plane of the lower surface. The potting composition 52 is mechanically locked in place underneath raised portions of the strip, each of which are canted at an angle less than 90° from the upper surface of the strip. In this manner the canted edge portions of the strip and the tabs 48 and 50 enhance adhesion of the composition to the strip.

The canted edge portions and tabs also serve another function. They increase the rigidity of the thin strip of ductile metal. While the preferred metal is copper, other ductile metals can be used including copper alloys, laminates of metals, kovar, etc. Thus even though the strip is formed of a readily deformable material the critical area of the strip has a construction which makes the strip fairly rigid in that area. In this manner the finished package is much more durable and resists deterioration due to handling and thermocycling, yet still is easily assembled. Moreover, even though the plastic potting composition is applied to only one surface of the strip, it does not readily separate from the strip nor is the semiconductive element soldered to the strip subjected to the high stresses caused by bending the strip. Subjecting the wafer to stresses of course may cause its resistivity to change thereby altering the predetermined electrical characteristics of the device.

The plastic potting composition envelops the terminal plateau areas 12' and 14', as well as the semiconductive element 46 and connecting terminal wires 42 and 44. After potting, terminal members 12 and 14 are supported by the potting and their separation from the strip 10 can be completed. Section 54 is then punched from the strip 10 to release the terminal elements 12 and 14, as can be seen in connection with FIG. 5. Section 54 communicates with notched areas 38 and 40 at points 56, so that the finished transistor is thereby released from the next adjacent section of the strip, yielding a finished discrete transistor package.

Terminals 12 and 14 can at this point be straightened or bent in any configuration desired to suit the particular application for which the device is intended. The terminals can be readily bent without damaging the finished device, since they are of a thin material. Moreover they are particularly durable in that any stresses applied to these terminals will not be transmitted to the semiconductive wafer within the package. The terminals are connected to the wafer by means of a flexible or readily deformable wire filament which will not transmit stresses applied to the terminal members themselves. In addition, the enlarged end sections 30 and 32 of the terminal members are embedded within the plastic potting composition. They mechanically lock the terminal members in place to enhance adhesion of the plastic potting composition. Hence even when bent or subjected to stress they are immobile within the plastic enclosure and do not impart stresses to the semiconductive element, or even to the wire bond connection therewith.

In its preferred embodiment, this invention is practiced by simultaneously making approximately six or eight transistor packages simultaneously from one strip. However, it is to be appreciated that a single device can be formed from a single strip, or that the devices can be successively formed from a long single strip in a continuous process wherein each step of the process is progressively formed along successive segments of the strip, and eventually each discrete finished package separated from the strip.

It is to be also understood that while this invention has been described in connection with a transistor package, the subject package design and process for making it can be used to make other types of semiconductive devices. For example, it can be used to make diodes. In this latter instance one may choose to raise only one edge portion, to form a single terminal, since only one terminal may be needed. On the other hand, if the semiconductive wafer is a planar diode, it may be more convenient to use two raised terminal members and not use the strip itself as a terminal member at all. Analogously, this technique can also be used for thyristors, in which instance up to five terminals can readily be provided. In this latter instance mirror image terminal members of terminal members 12 and 14 can be formed adjacent the raised end of terminal members 12 and 14. Additional terminals can be formed from raised strip portions in between parallel edge terminals. Moreover, the ends of the raised portions need not even be initially severed in some package designs. Both ends can be left exposed and severed after encapsulation.

Accordingly, our package design and process is readily adaptable to a variety of package applications. Since the opposite face of the strip to which the semiconductive element is applied is left exposed, the strip can be mounted directly in contact with a heat sink to provide a minimum distance heat path between the semiconductive element and the heat sink. Thus, our package design can be used in a multiplicity of applications which require high power dissipation yet a rugged economical package.

We claim:

1. An encapsulated semiconductor device comprising a flat metal strip having a main portion and a wider end portion of a given length, an elongated metal terminal member laterally adjacent to and parallel the length of said main strip portion, said metal strip and said terminal member being strips of the same metal and thickness, said terminal member having a length about equal to that of said strip main portion and a width about equal to the difference in width between the wider end portion of said strip and said main portion, a first part of said terminal member out of the plane of said strip, a second part of said terminal member in a common plane with said strip, an intermediate part of the terminal member bent about an axis transverse the terminal member and said strip, a semiconductor element on a central region of one major surface of said strip main portion adjacent said first terminal member part, a filamentary wire lead interconnecting said semiconductive element and said first terminal member part, means on said strip main portion for inhibiting binding of said central surface region, means on said strip for enhancing adhesion of encapsulating plastic to the strip, plastic encapsulation enveloping only said first terminal member part, said semiconductor element, said filamentary lead and said central surface region, leaving exposed the opposite major surface of said metal strip, ends of said metal strip and the second part of said terminal member.

2. A high power semiconductor device which includes all the features as defined in claim 1 and wherein the plastic encapsulation for the semiconductive element on said one surface of said strip does not extend beyond the plane of the opposite surface of said strip, opposite end portions of the strip protrude beyond the enclosure, and said end portions have means for mounting said semiconductor device.

3. The semiconductor device as defined in claim 2 wherein the means for inhibiting bending of the strip and enhancing adhesion of the plastic encapsulation to said strip includes edge and central sections of said strip at an acute angle to the plane of said strip, and said plastic encapsulation extends under said sections.

4. A semiconductor device which includes all the features as defined in claim 1 and includes the additional feature wherein the terminal member has means for enhancing its adhesion to the plastic encapsulation.

5. A power transistor assembly comprising a flat metal strip having a main portion and a wider end portion of a given length, a pair of mutually parallel elongated metal terminal members laterally adjacent to and parallel the length of said main strip portion, said metal strip and said terminal members being strips of the same metal and thickness, each of said terminal members having a length about equal to that of said strip main portion and a width about equal to one-half the difference in width between the wider end portion of said strip and said main portion, a first part of each terminal member out of the plane of said strip, a second part of each terminal member in a common plane with said strip, an intermediate part of each terminal member bent about an axis transverse the terminal members and said strip, a semiconductor element on a central surface region of said strip main portion between the first parts of said terminal members, a filamentary wire lead interconnecting said semiconductive element and each of said first terminal member parts, means on said strip main portion for inhibiting bending of said central surface region, means on said strip for enhancing adhesion of encapsulating plastic to said strip, plastic encapsulation enveloping only said first terminal member parts, said semiconductor element, said filamentary leads and said central surface region, leaving exposed the opposite surface of said strip, the ends of said strip and the second part of each terminal member.

6. A high power transistor assembly having all the features as defined in claim 5 and in which the plastic encapsulation does not extend from one surface of the strip beyond the plane of the opposite surface of said strip, longitudinally opposite end portions of the strip protrude beyond the plastic encapsulation, and said end portions have means for mounting said semiconductor device to a thermal transfer means.

7. The high power transistor assembly as defined in claim 6 wherein the means for inhibiting bending of the strip and enhancing adhesion of the plastic encapsulation to the strip includes edge and central sections of the strip at an acute angle to the element attachment surface of the strip, and said plastic encapsulation extends under said sections.

8. The transistor assembly as defined in claim 7 wherein the terminal members have means for enhancing adhesion to the plastic encapsulation, a non-rigid plastic composition isolates the wire filaments and semiconductive transistor element from the plastic encapsulation.

* * * * *